(12) United States Patent
Bessho et al.

(10) Patent No.: US 7,551,659 B2
(45) Date of Patent: Jun. 23, 2009

(54) SEMICONDUCTOR LASER APPARATUS

(75) Inventors: Yasuyuki Bessho, Hirakata (JP);
Masayuki Hata, Kadoma (JP); Daijiro Inoue, Kyoto (JP)

(73) Assignee: Sanyo Electric Co., Ltd., Osaka (JP)

( * ) Notice: Subject to any disclaimer, the term of this patent is extended or adjusted under 35 U.S.C. 154(b) by 253 days.

(21) Appl. No.: 11/081,726

(22) Filed: Mar. 17, 2005

(65) Prior Publication Data

US 2005/0232322 A1 Oct. 20, 2005

(30) Foreign Application Priority Data

Mar. 30, 2004 (JP) ............... 2004-101490
Sep. 30, 2004 (JP) ............... 2004-288973

(51) Int. Cl.
*H01S 5/00* (2006.01)

(52) U.S. Cl. .............. 372/50.121; 372/50.12; 372/50.122

(58) Field of Classification Search ........... 438/28, 438/26; 257/89, 90, 88; 372/23, 28, 38.05, 372/44.01, 46.01, 68, 50.1, 50.12, 50.121, 372/50.122, 36
See application file for complete search history.

(56) References Cited

U.S. PATENT DOCUMENTS

| | | | | |
|---|---|---|---|---|
| 4,925,811 | A * | 5/1990 | Menigaux et al. | 438/33 |
| 5,465,266 | A * | 11/1995 | Bour et al. | 372/46.01 |
| 5,638,391 | A * | 6/1997 | Shima et al. | 372/44.011 |
| 5,703,896 | A * | 12/1997 | Pankove et al. | 372/50.23 |
| 6,136,623 | A * | 10/2000 | Hofstetter et al. | 438/28 |
| 6,282,220 | B1 * | 8/2001 | Floyd | 372/50.1 |
| 6,410,904 | B1 * | 6/2002 | Ito et al. | 250/214 R |
| 7,079,563 | B2 * | 7/2006 | Miyachi et al. | 372/50.12 |
| 2001/0050531 | A1 * | 12/2001 | Ikeda | 313/498 |
| 2004/0109481 | A1 * | 6/2004 | Ikeda | 372/36 |
| 2004/0196877 | A1 * | 10/2004 | Kawakami et al. | 372/23 |

FOREIGN PATENT DOCUMENTS

JP 2001-230502 8/2001

(Continued)

OTHER PUBLICATIONS

D. Hofstetter, et al., "Multiwavelength light emitters for scanning applications fabricated by flipchip bonding," IEEE Photon. Technol. Lett., vol. 10, 1371 (1998).*

(Continued)

*Primary Examiner*—Minsun Harvey
*Assistant Examiner*—Michael Carter
(74) *Attorney, Agent, or Firm*—McDermott Will & Emery LLP

(57) ABSTRACT

A p-type pad electrode in a red semiconductor laser device and a first terminal are connected through a wire. A p-type pad electrode in an infrared semiconductor laser device and a second terminal are connected through a wire. A p-electrode in a blue-violet semiconductor laser device and a third terminal are connected through a wire. An n-electrode in the blue-violet semiconductor laser device is electrically conducting to amount. An n-electrode in the red semiconductor laser device and the mount are connected through a wire, while an n-electrode in the infrared semiconductor laser device and the mount is connected through a wire. The mount has a fourth terminal inside.

21 Claims, 9 Drawing Sheets

FOREIGN PATENT DOCUMENTS

| | | |
|---|---|---|
| JP | 2004-022717 | 1/2004 |
| JP | 2004-119580 | 4/2004 |

OTHER PUBLICATIONS

Chinese Office action with English translation, issued in Chinese Patent application No. CN 200510053941, issued on Feb. 15, 2008.*

U.S. Appl. No. 11/093,024, filed Mar. 30, 2005, Yasuyuki Bessho, et al.
U.S. Appl. No. 11/078,626, filed Mar. 14, 2005, Yasuyuki Bessho, et al.
U.S. Appl. No. 11/076,963, filed Mar. 11, 2005, Yasuyuki Bessho, et al.
U.S. Appl. No. 11/092,947, filed Mar. 30, 2005, Yasuyuki Bessho, et al.

* cited by examiner

F I G. 1
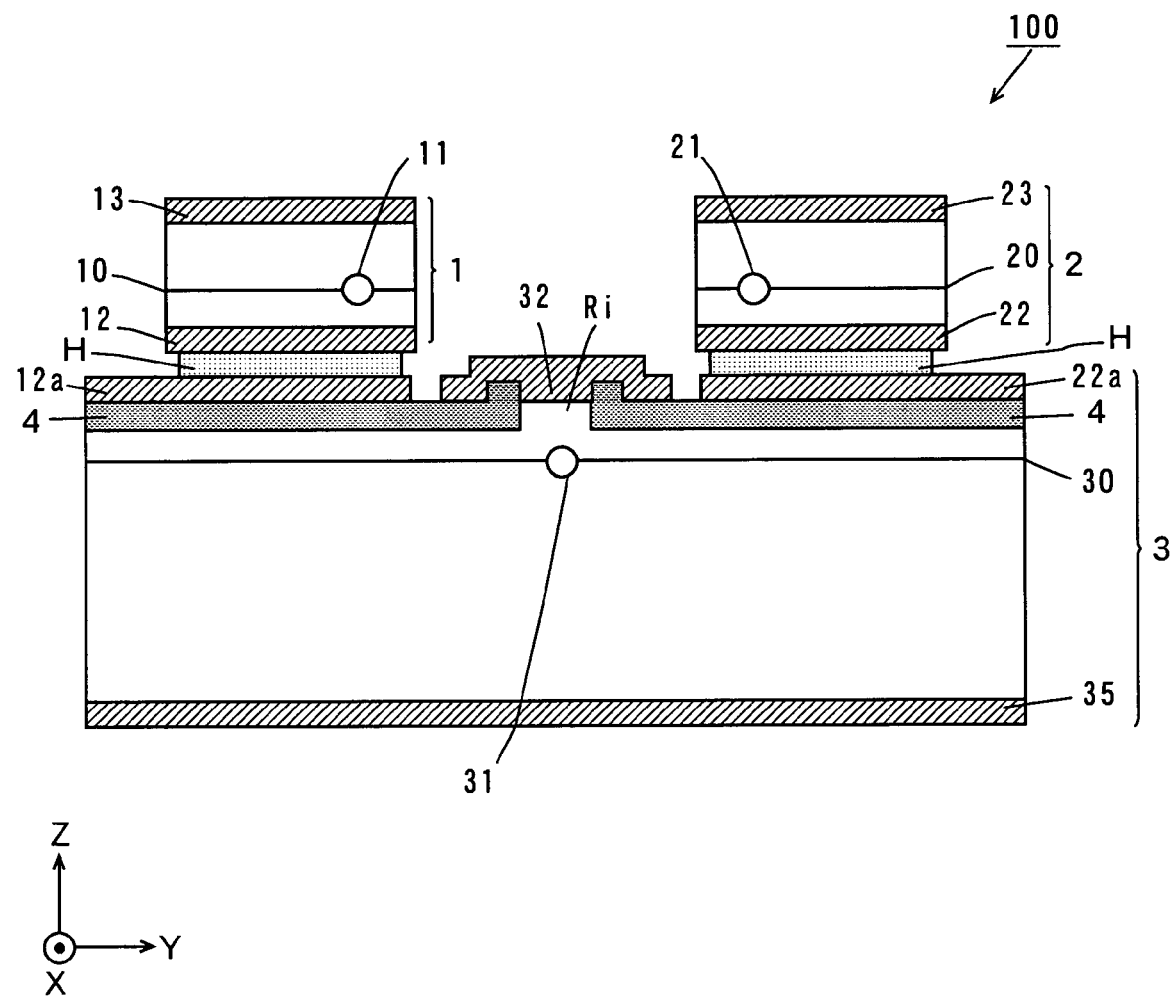

SEMICONDUCTOR LASER APPARATUS

BACKGROUND OF THE INVENTION

1. Field of the Invention

The present invention relates to a semiconductor laser apparatus.

2. Description of the Background Art

With recent enhancements of the performance of personal computers and multimedia equipment, the amount of information to be processed has markedly increased. The increased amount of information has led to the development of optical recording mediums and their drives which can handle increased capacity and increased speed of information processing.

Semiconductor laser apparatuses are used, in particular, in optical recording medium drives which are capable of reads and writes from and to optical recording mediums, such as a CD-R (Compact Disk-Recordable) drive, an MO (Magneto-optical) drive, or a DVD (Digital Versatile Disk) drive.

In a light-emission device disclosed in JP 2002-230502 A, for example, a plurality of pins having electrical conductivity are provided on a support base which supports semiconductor laser devices. The plurality of pins, respectively, are connected to an n-side electrode and a p-side electrode in each of the semiconductor laser devices through wires. With this structure, when a voltage is applied between the n-side electrode and the p-side electrode in each of the semiconductor laser devices, a current is injected in an active layer which is formed in each semiconductor laser device, causing recombination of holes and electrons to emit light.

In the above-described light emitting device, however, a red semiconductor laser device that emits a red beam light and an infrared semiconductor laser device that emits an infrared beam light have a common n-side electrode, while the red semiconductor laser device and a blue-violet semiconductor laser device that emits a blue-violet beam of light have a common p-side electrode and a common n-side electrode. This makes it difficult to apply an arbitrary voltage to each of the red semiconductor laser device, infrared semiconductor laser device, and blue-violet semiconductor laser device independently.

SUMMARY OF THE INVENTION

It is an object of the present invention to provide a semiconductor laser apparatus that comprises a plurality of semiconductor laser devices, in which the electrodes of each of the plurality of semiconductor laser devices can receive voltage independently.

A semiconductor laser apparatus according to one aspect of the present invention comprises: an electrically conducting package; an electrically conducting mount provided on the package; first, second, and third terminals that are provided on the package and isolated from the package; a fourth terminal that is provided on the package and electrically connected to the mount; and first, second, and third semiconductor laser devices that are provided on the mount, each having a first electrode, wherein the first terminal and the second terminal are arranged along a first direction, the third terminal and the fourth terminal are arranged along a second direction that crosses with the first direction, the first, second, and third semiconductor laser devices are arranged such that the first electrode of the first semiconductor laser device is located closer to the first terminal than the first electrodes of the second and third semiconductor laser devices, the first electrode of the second semiconductor laser device is located closer to the second terminal than the first electrodes of the first and third semiconductor laser devices, and at least a portion of the first electrode of the third semiconductor laser device is located between the first electrode of the first semiconductor laser device and the first electrode of the second semiconductor laser device in the first direction, the first terminal and the first electrode of the first semiconductor laser device are connected through a first wire, the second terminal and the first electrode of the second semiconductor laser device are connected through a second wire, and the third terminal and the first electrode of the third semiconductor laser device are connected through a third wire, and the third semiconductor laser device further has a second electrode that is electrically connected to the mount.

In the semiconductor laser apparatus, the first terminal and the first electrode of the first semiconductor laser device are connected through the first wire, the second terminal and the first electrode of the second semiconductor laser device are connected through the second wire, and the third terminal and the first electrode of the third semiconductor laser device are connected through the third wire. This allows each of the first semiconductor laser device, second semiconductor laser device, and third semiconductor laser device to be driven independently.

Moreover, the first electrode of the first semiconductor laser device is located closer to the first terminal than the first electrodes of the second and third semiconductor laser devices, so that the first electrode of the first semiconductor laser device and the first terminal can be connected simply and easily through the first wire. The first electrode of the second semiconductor laser device is located closer to the second terminal than the first electrodes of the first and third semiconductor laser devices, so that the first electrode of the second semiconductor laser device and the second terminal can be connected simply and easily through the second wire. The at least a portion of the first electrode of the third semiconductor laser device is located between the first electrode of the first semiconductor laser device and the first electrode of the second semiconductor laser device in the first direction, so that the first electrode of the third semiconductor laser device and the third terminal can be connected simply and easily through the third wire.

It is preferred that the first semiconductor laser device and the second semiconductor laser device are provided on the third semiconductor laser device. This allows spacing among the laser beams emitted from the respective first, second, and third semiconductor laser devices to be narrower.

The third semiconductor laser device may have a ridge portion formed on the first electrode side of the third semiconductor laser device and an insulating film formed on side surfaces of the ridge portion, the ridge portion being provided between the first semiconductor laser device and the second semiconductor laser device. In this case, the first electrode of the third semiconductor laser device and the third terminal can be connected simply and easily through the third wire.

It is preferred that a first connection position of the first wire and the first electrode of the first semiconductor laser device, a third connection position of the third wire and the first electrode of the third semiconductor laser device, and a second connection position of the second wire and the first electrode of the second semiconductor laser device are arranged in this order from the first terminal side to the second terminal side in the first direction. This prevents the first, second, and third wires from crossing one another.

The third connection position may be set on an opposite side of a laser beam emitting side of each of the first, second, and third semiconductor laser devices relative to at least one of the first and second connection positions. This decreases the inductance component of the third wire, thereby driving the third semiconductor laser device at high speed.

The first, second, and third terminals may extend from one side to another side along a third direction that crosses with the first direction and the second direction, the first, second, and third semiconductor laser devices being arranged to emit main laser beams toward the other side along the third direction, each of the first and second semiconductor laser devices further having a second electrode, and the second electrode of the first semiconductor laser device being electrically connected to the mount through a fourth wire in a position on the laser beam emitting side of the first semiconductor laser device relative to the first connection position. In this case, the second electrode of the first semiconductor laser device and the second electrode of the third semiconductor laser device can be commonly connected to the mount through the fourth wire.

The second electrode of the second semiconductor laser device may be electrically connected to the mount through a fifth wire in a position on the laser beam emitting side of the second semiconductor laser device relative to the second connection position. In this case, the second electrode of the second semiconductor laser device and the second electrode of the third semiconductor laser device can be commonly connected to the mount through the fifth wire.

A semiconductor laser apparatus according to another aspect of the present invention comprises: an electrically conducting package; an electrically conducting mount provided on the package; first, second, and third terminals that are provided on the package and isolated from the package; a fourth terminal that is provided on the package and electrically connected to the mount; and first, second, and third semiconductor laser devices that are provided on the mount, each having a first electrode, wherein the first terminal and the second terminal are arranged along a first direction, the third terminal and the fourth terminal are arranged along a second direction that crosses with the first direction, the first, second, and third semiconductor laser devices are arranged such that the first electrode of the first semiconductor laser device is located closer to the first terminal than the first electrodes of the second and third semiconductor laser devices, and the first electrode of the second semiconductor laser device is located closer to the second terminal than the first electrodes of the first and third semiconductor laser devices, the semiconductor laser apparatus further comprises a submount between the first electrode of the third semiconductor laser device and the mount, the first electrode of the third semiconductor laser device is formed on the submount to protrude from the third semiconductor laser device, the first terminal and the first electrode of the first semiconductor laser device are connected through a first wire, the second terminal and the first electrode of the second semiconductor laser device are connected through a second wire, and the third terminal and the first electrode of the third semiconductor laser device are connected through a third wire on the submount, and the second electrode of the third semiconductor laser device is electrically connected to the mount.

In the semiconductor laser apparatus, the first terminal and the first electrode of the first semiconductor laser device are connected through the first wire, the second terminal and the first electrode of the second semiconductor laser device are connected through the second wire, and the third terminal and the first electrode of the third semiconductor laser device are connected through the third wire. This allows each of the first semiconductor laser device, second semiconductor laser device, and third semiconductor laser device to be driven independently.

Moreover, the first electrode of the first semiconductor laser device is located closer to the first terminal than the first electrodes of the second and third semiconductor laser devices, so that the first electrode of the first semiconductor laser device and the first terminal can be connected simply and easily through the first wire. The first electrode of the second semiconductor laser device is located closer to the second terminal than the first electrodes of the first and third semiconductor laser devices, so that the first electrode of the second semiconductor laser device and the second terminal can be connected simply and easily through the second wire. The first electrode of the third semiconductor laser device is formed on the submount to protrude from the third semiconductor laser device, so that the first electrode of the third semiconductor laser device and the third terminal can be connected on the submount simply and easily through the third wire.

It is preferred that at least a portion of the first electrode of the third semiconductor laser device is located closer to the third terminal than the first electrodes of the first and second semiconductor laser devices. In this manner, the first electrode of the third semiconductor laser device and the third terminal can be connected more simply and easily through the third wire.

It is preferred that the first semiconductor laser device and the second semiconductor laser device are provided on the third semiconductor laser device. This allows spacing among the laser beams emitted from the respective first, second, and third semiconductor laser devices to be narrower.

It is preferred that a first connection position of the first wire and the first electrode of the first semiconductor laser device, a third connection position of the third wire and the first electrode of the third semiconductor laser device, and a second connection position of the second wire and the first electrode of the second semiconductor laser device are arranged in this order from the first terminal side to the second terminal side in the first direction. This prevents the first, second, and third wires from crossing one another.

The third connection position may be set on an opposite side of a laser beam emitting side of each of the first, second, and third semiconductor laser devices relative to at least one of the first and second connection positions. This decreases the inductance component of the third wire, thereby driving the third semiconductor laser device at high speed.

The first, second, and third terminals may extend from one side to another side along a third direction that crosses with the first direction and the second direction, the first, second, and third semiconductor laser devices being arranged to emit main laser beams toward the other side along the third direction, each of the first and second semiconductor laser devices further having a second electrode, the second electrodes of the first, second, and third semiconductor laser devices being electrically connected with one another, and the second electrode of the third semiconductor laser device being electrically connected to the mount through a fourth wire in a position on the laser beam emitting side of the first semiconductor laser device relative to the first connection position.

In this case, the second electrodes of the first, second, and third semiconductor laser devices are electrically connected with one another, so that the second electrodes of the first, second, and third semiconductor laser devices can be commonly connected to the mount through the fourth wire.

A semiconductor laser apparatus according to still another aspect of the present invention comprises: an electrically conducting package; an electrically conducting mount provided on the package; first, second, and third terminals that are provided on the package and isolated from the package; a fourth terminal that is provided on the package and electrically connected to the mount; and first, second, and third semiconductor laser devices that are provided on the mount, each having a first electrode, wherein the first terminal and the second terminal are arranged along a first direction, the third terminal and the fourth terminal are arranged along a second direction that crosses with the first direction, an emission portion of the first semiconductor laser device, an emission portion of the third semiconductor laser device, and an emission portion of the second semiconductor laser device are arranged in this order from the first terminal side to the second terminal side along the first direction, the first electrode of the third semiconductor laser device extends in the first direction closer to the second terminal than a side surface of the second semiconductor laser device on the second terminal side, the first terminal and the first electrode of the first semiconductor laser device are connected through a first wire, the second terminal and the first electrode of the third semiconductor laser device are connected through a third wire, and the third terminal and the first electrode of the second semiconductor laser device are connected through a second wire, and the third semiconductor laser device emits a laser beam with a wavelength shorter than the wavelengths of laser beams emitted from the first and second semiconductor laser devices, and further has an a second electrode which is electrically connected to the mount.

In the semiconductor laser apparatus, the emission portion of the third semiconductor laser that emits a laser beam with a wavelength shorter than the wavelengths of laser beams emitted from the first and second semiconductor laser devices is located between the emission portion of the first semiconductor laser device and the emission portion of the second semiconductor laser device in the first direction. Thus, the third semiconductor laser device is positioned on the central portion of the package. This allows for improved light utilization efficiency through the emission portion of the third semiconductor laser device when converging the light beam through a lens, for example.

Moreover, the first electrode of the third semiconductor laser device extends in the first direction closer to the second terminal than the side surface of the second semiconductor laser device on the second terminal side. In this manner, the length of the third wire can be shorter which connects the second terminal with the first electrode of the third semiconductor laser device that emits a wavelength shorter than those of the first and second semiconductor laser devices. This decreases the inductance component of the third wire, thereby driving the third semiconductor laser device at high speed.

In addition, the first electrode of the first semiconductor laser device and the first terminal can be connected simply and easily through the first wire. The first electrode of the third semiconductor laser device and the second terminal can be connected simply and easily through the third wire. The first electrode of the second semiconductor laser device and the third terminal can be connected simply and easily through the second wire.

The first, second, and third terminals may extend from one side to another side along a third direction that crosses with the first direction and the second direction, the first, second, and third semiconductor laser devices being arranged to emit main laser beams toward the other side along the third direction, each of the first and second semiconductor laser devices further having a second electrode, and the second electrode of the first semiconductor laser device being electrically connected to the mount through a fourth wire in a position on the laser beam emitting side of the first semiconductor laser device relative to a first connection position of the first wire and the first electrode of the first semiconductor laser device.

In this case, the second electrode of the first semiconductor laser device and the second electrode of the third semiconductor laser device can be commonly connected to the mount through the fourth wire.

The second electrode of the second semiconductor laser device may be electrically connected to the mount through a fifth wire in a position on the laser beam emitting side of the second semiconductor laser device relative to a second connection position of the second wire and the first electrode of the second semiconductor laser device.

In this case, the second electrode of the second semiconductor laser device and the second electrode of the third semiconductor laser device can be commonly connected to the mount through the fifth wire.

The second connection position may be set on an opposite side of a laser beam emitting side of each of the first, second, and third semiconductor laser devices relative to at least one of the first connection position and a third connection position of the third wire and the first electrode of the third semiconductor laser device. This decreases the inductance component of the third wire, thereby driving the third semiconductor laser device at high speed.

It is preferred that when the first, second, and third semiconductor laser devices are viewed in the second direction, the first, second, third and fourth wires are not crossing one another. In this manner, wiring of the electrodes, terminals, and mount can be made simply and easily.

The third semiconductor layer device may include an active laser composed of a nitride-based semiconductor. In this case, a blue-violet beam of light is emitted from the active layer of the third semiconductor laser device.

The length of the third terminal may be shorter than the length of each of the first and second terminals, the first, second, and third terminals extending from one side to another side along a third direction that crosses with the first direction and the second direction, the first, second, and third semiconductor laser devices being arranged to emit main laser beams toward the other side along the third direction, the first, second, and third semiconductor laser devices being arranged between the first terminal and the second terminal in the first direction, and the length of the third terminal being set such that the third terminal does not overlap with a facet opposite to a laser beam emitting side of each of the first, second, and third semiconductor laser devices. This allows the first, second, and third semiconductor laser devices to be easily mounted on the mount without being prevented by the third terminal.

A semiconductor laser apparatus according to yet another aspect of the present invention comprises: an electrically conducting package; an electrically conducting mount that is provided on the package; first and second terminals that are provided on the package and isolated from the package; and first and second semiconductor laser devices that are provided on the mount, each having a first electrode and a second electrode, wherein the first semiconductor laser device is provided on the second semiconductor laser device, the first terminal and the second terminal are arranged along a first direction, the first terminal and the first electrode of the first semiconductor laser device are connected through a first wire, while the second terminal and the first electrode of the second semiconductor laser device are connected through a second wire, and at least one of the second electrodes of the first and second semiconductor laser devices is electrically connected to the mount through a wire on the mount side.

In the semiconductor laser apparatus, the first terminal and the first electrode of the first semiconductor laser device are connected through the first wire, while the second terminal and the first electrode of the second semiconductor laser device are connected through the second wire. This allows each of the first semiconductor laser device and second semiconductor laser device to be driven independently.

It is preferred that the first semiconductor laser device is located closer to the first terminal than the second terminal on the second semiconductor laser device. This allows the first electrode of the first semiconductor laser device and the first terminal to be connected simply and easily through the first wire, while preventing the first wire and the second wire from crossing each other.

The second semiconductor laser device may include an active layer composed of a nitride-based semiconductor. In this case, a blue-violet beam of light is emitted from the active layer of the second semiconductor laser device.

At least one of the second electrodes of the first and second semiconductor laser devices may be electrically connected to the mount through the wire on the mount side in a position on a laser beam emitting side of the first semiconductor laser device, relative to a first connection position of the first wire and the first electrode of the first semiconductor laser device or a second connection position of the second wire and the first electrode of the second semiconductor laser device. This prevents the wire on the mount side from crossing each of the first wire and second wire.

In the first to third inventions, each of the first semiconductor laser device, second semiconductor laser device, and third semiconductor laser device can be driven independently, while the first electrode of each of the first to third semiconductor laser devices can be connected with each of the terminals through a wire simply and easily.

In the fourth embodiment, each of the first semiconductor laser device and second semiconductor laser device can be driven independently, while the first electrode of each of the first and second semiconductor laser devices can be connected with each of the terminals through a wire simply and easily.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a schematic cross-section showing an example of a semiconductor laser apparatus according to a first embodiment;

DESCRIPTION OF THE PREFERRED EMBODIMENTS

Figure 2:
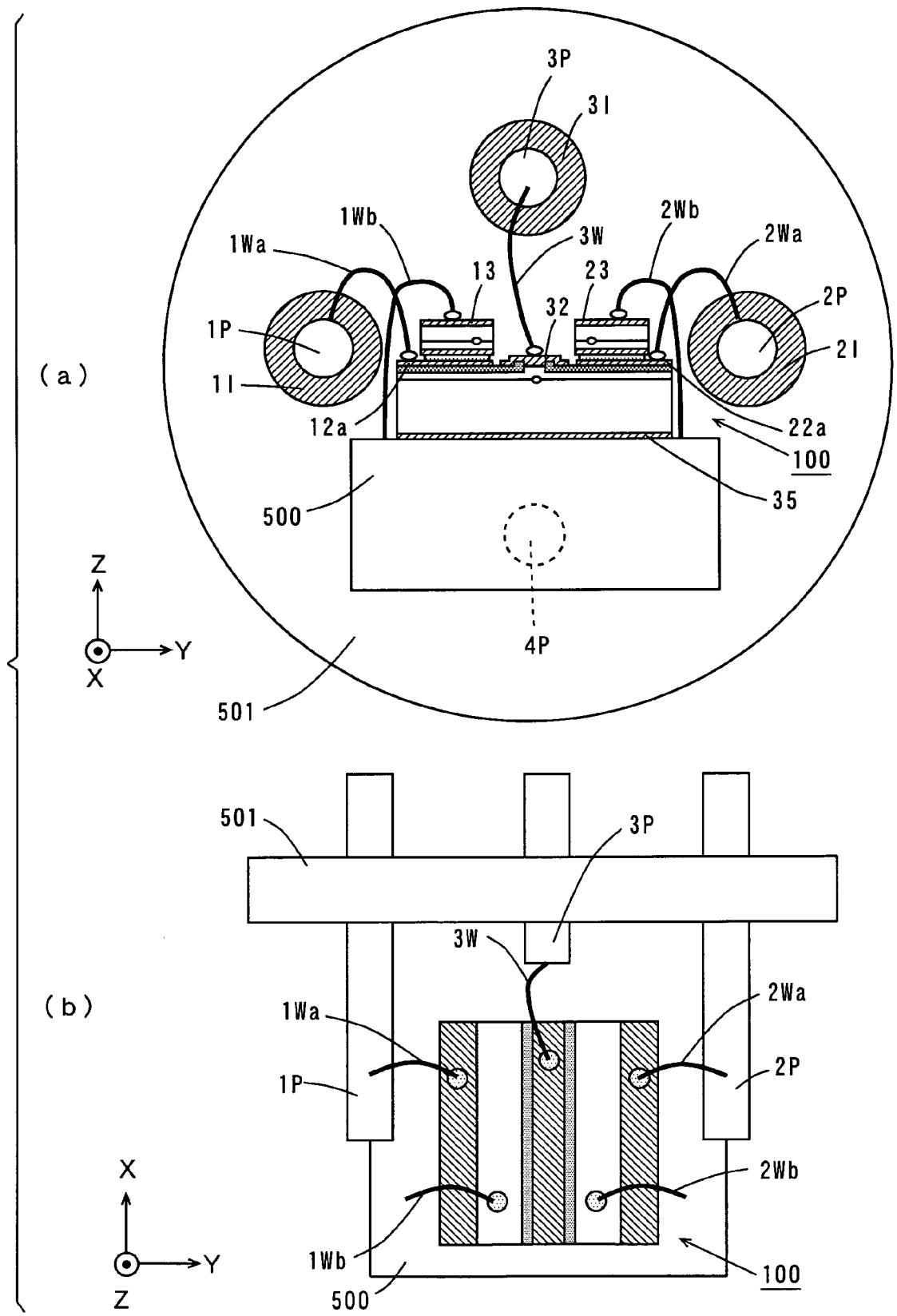
FIG. 2(a) is a schematic cross-section showing the semiconductor laser apparatus of FIG. 1 when assembled on a mount.
FIG. 2(b) is a top view of the semiconductor laser apparatus of FIG. 1 when assembled on the mount.

A semiconductor laser apparatus according to an embodiment of the present invention will now be described with reference to the drawings.

First Embodiment

FIG. 1 is a schematic cross-section showing an example of a semiconductor laser apparatus according to a first embodiment.

The semiconductor laser apparatus 100 according to the embodiment comprises a semiconductor laser apparatus (hereinafter referred to as a red semiconductor laser device) 1 that emits a laser beam with a wavelength of approximately 650 nm, a semiconductor laser apparatus (hereinafter referred to as an infrared semiconductor laser device) 2 that emits a laser beam with a wavelength of approximately 780 nm, and a semiconductor laser apparatus (hereinafter referred to as a blue-violet semiconductor laser device) 3 that emits a laser beam with a wavelength of approximately 400 nm. The blue-violet semiconductor laser device 3 includes an active layer composed of a nitride-based semiconductor (not shown).

In the embodiment, the blue-violet semiconductor laser device 3 is fabricated by forming semiconductor layers on the GaN substrate. The red semiconductor laser device 1 and the infrared semiconductor laser device 2 are fabricated by forming semiconductor layers on the GaAs substrate.

As shown in FIG. 1, the blue-violet semiconductor laser device 3 has a stripe-like ridge portion Ri on an upper surface. An insulating film 4 is formed on both sides of the ridge portion Ri in the blue-violet semiconductor laser device 3, and a p-electrode 32 is formed to cover an upper surface of the ridge portion Ri. An n-electrode 35 is formed on a lower surface of the blue-violet semiconductor laser device 3. In the blue-violet semiconductor laser device 3, a p-n junction surface 30 is formed where a p-type semiconductor and an n-type semiconductor are joined together.

The red semiconductor laser device 1 has an n-electrode 13 formed on an upper surface and a p-electrode 12 formed on a lower surface. In the red semiconductor laser device 1, a p-n junction surface 10 is formed where a p-type semiconductor and an n-type semiconductor are joined together.

The infrared semiconductor laser device 2 has an n-electrode 23 formed on an upper surface and a p-electrode 22 formed on a lower surface. In the infrared semiconductor laser device 2, a p-n junction surface 20 is formed where a p-type semiconductor and an n-type semiconductor are joined together.

On the insulating film 4 of the blue-violet semiconductor laser device 3, p-type pad electrodes 12a, 22a are formed at a distance from the p-type electrode 32.

Solder films H are formed on upper surfaces of the p-type pad electrodes 12a, 22a, respectively. In the red semiconductor laser device 1, the p-electrode 12 is joined to the p-type pad electrode 12a with the solder film H therebetween. In the infrared semiconductor laser device 2, the p-electrode 22 is joined to the p-type pad electrode 22a with the solder film H therebetween.

This allows for an electrical connection between the p-electrode 12 and the p-type pad electrode 12a in the red semiconductor laser device 1, and an electrical connection between the p-electrode 22 and the p-type pad electrode 22a in the infrared semiconductor laser device 2.

In FIG. 1, the arrows X, Y, Z indicate three directions, X-direction, Y-direction, and Z-direction, which are orthogonal to one another. The X- and Y-directions are in parallel with the p-n junction surfaces 30, 10, 20 in the blue-violet semiconductor laser device 3, red semiconductor laser device 1, and infrared semiconductor laser device 2. The Z-direction is vertical to the p-n junction surfaces 30, 10, 20 in the blue-violet semiconductor laser device 3, red semiconductor laser device 1, and infrared semiconductor laser device 2.

The red semiconductor laser device 1, infrared semiconductor laser device 2, and blue-violet semiconductor laser device 3 are arranged to emit main laser beams toward one side along the X-direction.

When a voltage is applied between the p-electrode 32 and the n-electrode 35 in the blue-violet semiconductor laser device 3, a laser beam with a wavelength of approximately 400 nm is emitted in the X-direction from a region 31 (hereinafter referred to as a blue-violet-beam-emission point) below the ridge portion Ri in the p-n junction surface 30.

When a voltage is applied between the p-electrode 12 and the n-electrode 13 in the red semiconductor laser device 1, a laser beam with a wavelength of approximately 650 nm is emitted in the X-direction from a prescribed region 11 (hereinafter referred to as a red-beam-emission point) in the p-n junction surface 10.

When a voltage is applied between the p-electrode 22 and the n-electrode 23 in the infrared semiconductor laser device 2, a laser beam with a wavelength of approximately 780 nm is emitted in the X-direction from a prescribed region 21 (hereinafter referred to as an infrared-beam-emission point) in the p-n junction surface 20.

FIG. 2(a) is a schematic cross-section showing the semiconductor laser apparatus 100 of FIG. 1 when assembled on a mount. FIG. 2(b) is a top view of the semiconductor laser apparatus 100 of FIG. 1 when assembled on the mount.

When the semiconductor laser apparatus 100 of FIG. 1 is used in an optical pick-up, it is mounted on a mount 500 which is composed of a conducting metal such as Cu, CuW, or Al. Then, using wires 3W, 1Wa, 1Wb, 2Wa, 2Wb, the p-electrodes 32, 12a, 22a and the n-electrodes 13, 23 are wired.

In this case, the n-electrode 35 is joined to an upper surface of the mount 500. This allows for an electrical connection between the n-electrode 35 and the mount 500.

The n-electrode 13 in the red semiconductor laser device 1 is electrically connected to the upper surface of the mount 500 through the wire 1Wb. The n-electrode 23 in the infrared semiconductor laser device 2 is electrically connected to the mount 500 through the wire 2Wb.

This makes the mount 500 a common n-electrode among the blue-violet semiconductor laser device 3, red semiconductor laser device 1, and infrared semiconductor laser device 2, so as to realize a common-cathode wire connection.

The mount 500 having the semiconductor laser apparatus 100 mounted thereon is provided on a conducting stem 501.

The stem 501 is provided with a first terminal 1P, a second terminal 2P, a third terminal 3P, and a fourth terminal 4P. The length of the third terminal 3P is shorter than the length of each of the first terminal 1P and the second terminal 2P.

The first terminal 1P is isolated from the stem 501 by an insulating ring 1I. The second terminal 2P is isolated from the stem 501 by an insulating ring 2I. The third terminal 3P is isolated from the stem 501 by an insulating ring 3I. The fourth terminal 4P, which is provided inside the mount 500, is electrically conducting to the mount 500.

The first terminal 1P and the second terminal 2P are arranged along the Y-direction, while the third terminal 3P and the fourth terminal 4P are arranged along the Z-direction that crosses with the Y-direction. The first terminal 1P, second terminal 2P, and third terminal 3P extend from one side to another along the X-direction.

The red semiconductor laser device 1, infrared semiconductor laser device 2, and blue-violet semiconductor laser device 3 are arranged in the Y-direction between the first terminal 1P and the second terminal 2P.

The length of the third terminal 3P is set such that the third terminal 3P does not overlap with a facet opposite to an emission side of a facet that emits the main laser beam in each of the red semiconductor laser device 1, infrared semiconductor laser device 2, and blue-violet semiconductor laser device 3.

As used herein, the facet that emits the main laser beam refers to a facet whereby a greater amount of light is emitted than the opposite facet (hereinafter referred to as a facet on the emission side).

Now, description is made of the positions of the p-type pad electrode 12a, p-type pad electrode 22a, and p-electrode 32 in the blue-violet semiconductor laser device 3, and the positions of the first terminal 1P, second terminal 2P, and third terminal 3P.

The red semiconductor laser device 1, the infrared semiconductor laser device 2, and the blue-violet semiconductor laser device 3, respectively, are arranged such that the p-type pad electrode 12a is located closer to the first terminal 1P than the p-type pad electrode 22a and the p-electrode 32 in the blue-violet semiconductor laser device 3, the p-type pad electrode 22a is located closer to the second terminal 2P than the p-type pad electrode 12a and the p-electrode 32 in the blue-violet semiconductor laser device 3, and the p-electrode 32 in the blue-violet semiconductor laser device 3 is located between the p-type pad electrode 12a and the p-type pad electrode 22a in the Y-direction.

Thus, as shown in FIG. 2(b), the first terminal 1P and the p-type pad electrode 12a are connected through the wire 1Wa simply and easily. Similarly, the second terminal 2P and the p-type pad electrode 22a are connected through the wire 2Wa simply and easily, and the third terminal 3P and the p-electrode 32 in the blue-violet semiconductor laser device 3 are connected through the wire 3W simply and easily.

Note also that when the red semiconductor laser device 1, infrared semiconductor laser device 2, and blue-violet semiconductor laser device 3 are viewed in the Z-direction, the wires 1Wa, 2Wa, 3W, 1Wb, 2Wb are not crossing one another.

In the present embodiment as described above, application of voltage between the mount 500 and the wire 3W enables driving the blue-violet semiconductor laser device 3. Similarly, application of voltage between the mount 500 and the wire 1Wa enables driving the red semiconductor laser device 1, and the application of voltage between the mount 500 and the wire 2Wa enables driving the infrared semiconductor laser device 2.

In this manner, each of the blue-violet semiconductor laser device 3, red semiconductor laser device 1, and infrared semiconductor laser device 2 can be driven independently.

In addition, the blue-violet-beam-emission point 31 in the blue-violet semiconductor laser device 3 that emits a laser beam with a wavelength shorter than the wavelengths of the laser beams emitted from the red semiconductor laser device 1 and the infrared semiconductor laser device 2 is located in the Y-direction between the red-beam-emission point 11 in the red semiconductor laser device 1 and the infrared-beam-emission point 21 in the infrared semiconductor laser device 2. This allows the blue-violet semiconductor laser device 3 to be easily positioned on a lens when the semiconductor laser apparatus 100 is used in an optical device such as an optical pick-up.

As a result, the effect of aberration around the periphery of the lens can be decreased, while the light utilization efficiency can be improved in the blue-violet semiconductor laser device 3.

It is also preferred that the connection position of the wire 1Wa and the p-type pad electrode 12a in the red semiconductor laser device 1, the connection position of the wire 3W and the p-electrode 32 in the blue-violet semiconductor laser device 3, and the connection position of the wire 2Wa and the p-type pad electrode 22a in the infrared semiconductor laser device 2 are arranged in this order between the first terminal 1P and the second terminal 2P in the Y-direction. This prevents the wires 1Wa, 2Wa, 3W from crossing one another.

Further, the length of the third terminal 3P is shorter than the length of each of the first terminal 1P and second terminal 2P. The red semiconductor laser device 1, the infrared semiconductor laser device 2, and the blue-violet semiconductor laser device 3 are arranged between the first terminal 1P and the second terminal 2P in the Y-direction. Also, the length of the third terminal 3P is set such that it does not overlap in the X-direction with the facet opposite to the facet on the laser beam emitting side of each of the red semiconductor laser device 1, infrared semiconductor laser device 2, and blue-violet semiconductor laser device 3. This allows the p-electrode 32 in the blue-violet semiconductor laser device 3 and the third terminal 3P to be connected simply and easily through the wire 3W.

Furthermore, it is preferred that the connection position of the p-electrode 32 in the blue-violet semiconductor laser device 3 and the third terminal 3P is set on the opposite side of the laser beam emitting side of each of the red semiconductor laser device 1, infrared semiconductor laser device 2, and blue-violet semiconductor laser device 3 relative to at least one of the connection position of the p-type pad electrode 12a in the red semiconductor laser device 1 and the first terminal 1P and the connection position of the p-type pad electrode 22a in the infrared semiconductor laser device 2 and the second terminal 2P. This allows the wire 3W to be shorter with a smaller inductance component, thereby driving the blue-violet semiconductor laser device 3 at high speed.

As shown in FIG. 2(a), it is preferred that the first terminal 1P, second terminal 2P, third terminal 3P and fourth terminal 4P are provided substantially concentrically on the stem 501. This prevents each of the wires that connects each semiconductor laser device and each terminal from crossing one another.

Note that the positions in which the red semiconductor laser device 1 and infrared semiconductor laser device 2 are arranged may be reversed.

The red semiconductor laser device 1 and infrared semiconductor laser device 2 may each have a monolithic structure.

A submount composed of silicon carbide or aluminum nitride may also be provided between the blue-violet semiconductor laser device 3 and the mount 500. In this manner, dissipation of heat from the blue-violet semiconductor laser device 3 is achieved.

Second Embodiment

Figure 3:
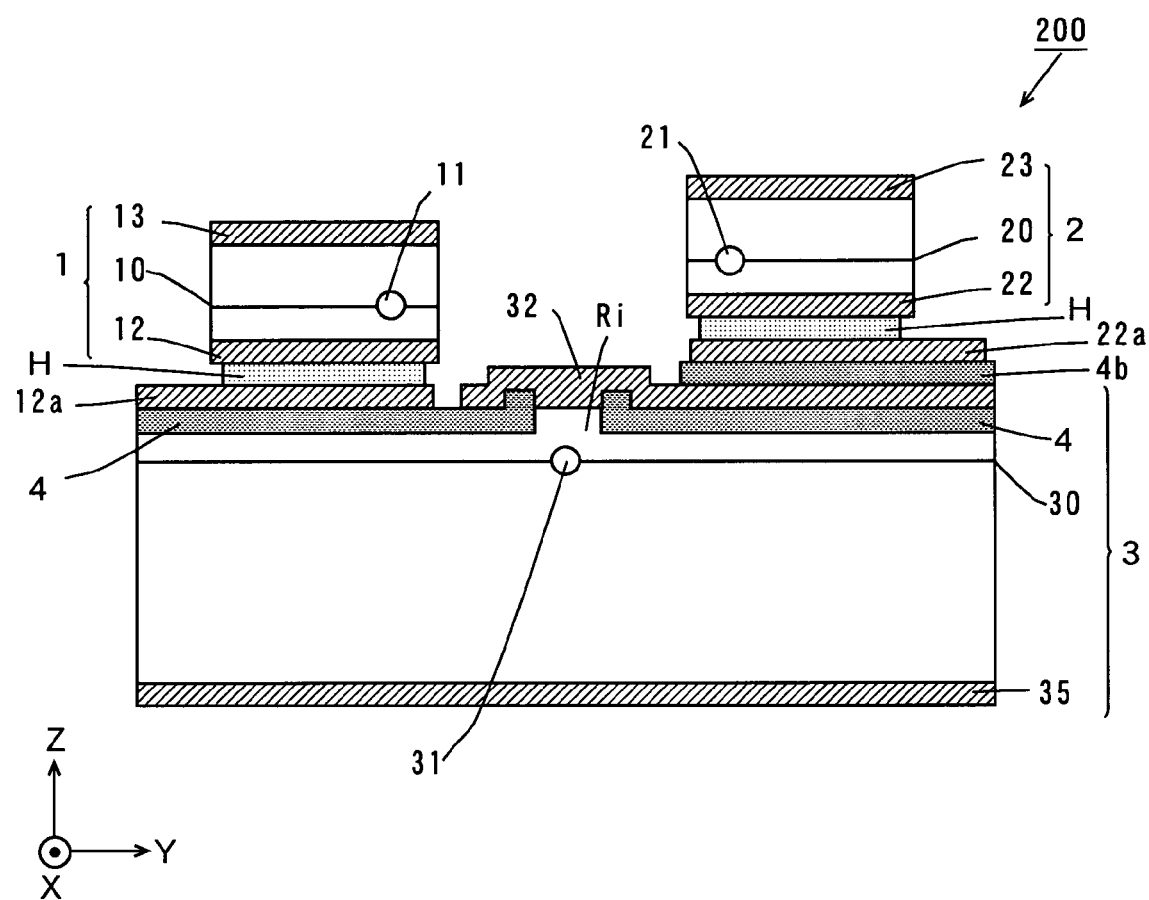
FIG. 3 is a schematic cross-section showing an example of a semiconductor laser apparatus according to a second embodiment.
Figure 4:
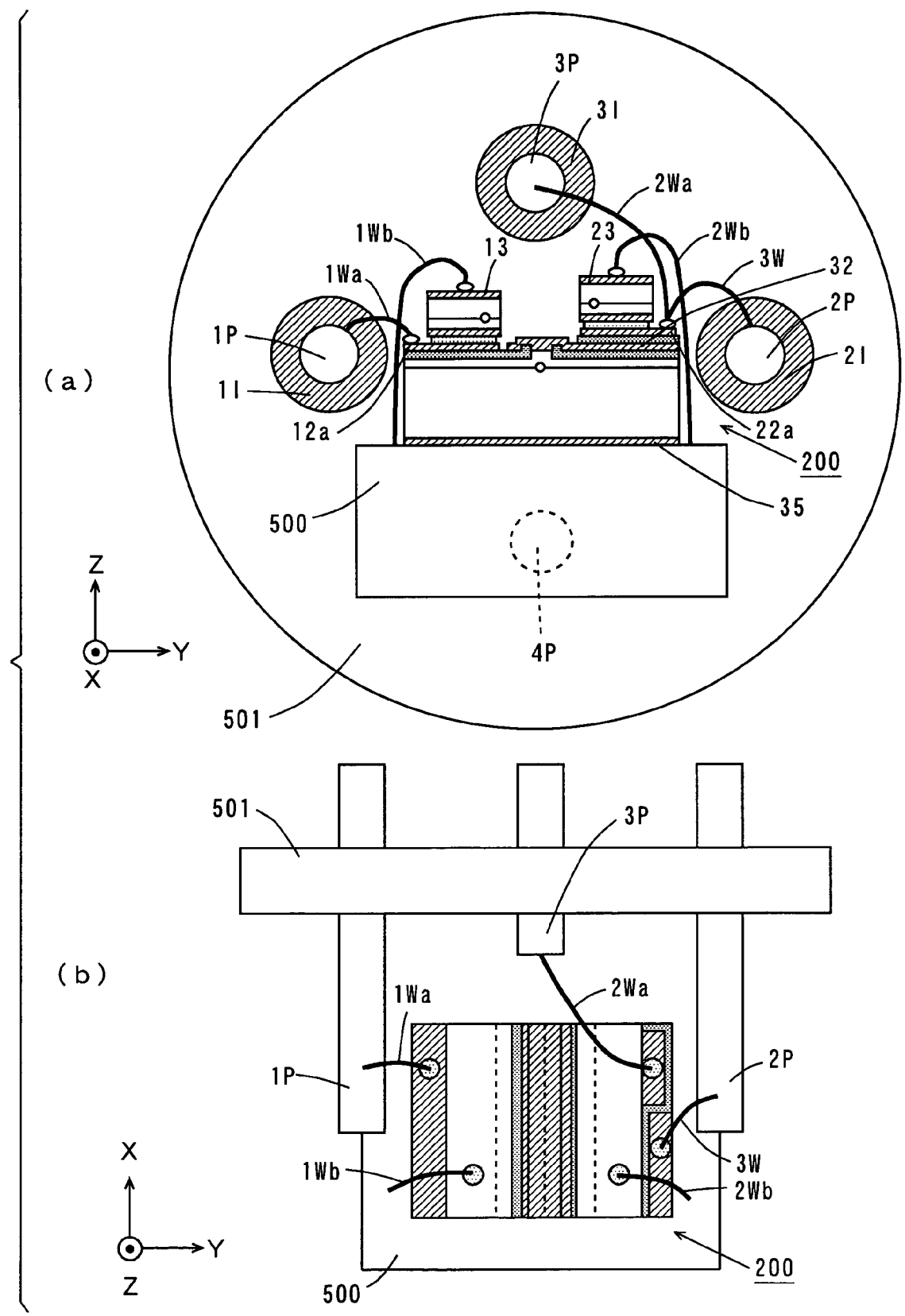
FIG. 4(a) is a schematic cross-section showing the semiconductor. laser apparatus of FIG. 3 when assembled on a mount.
FIG. 4(b) is a top view showing the semiconductor laser apparatus of FIG. 3 when assembled on the mount.

FIG. 3 is a schematic cross-section showing an example of a semiconductor laser apparatus according to a second embodiment. FIG. 4(a) is a schematic cross-section showing the semiconductor laser apparatus of FIG. 3 when assembled on a mount. FIG. 4(b) is a top view showing the semiconductor laser apparatus of FIG. 3 when assembled on the mount.

The semiconductor laser apparatus 200 according to the present embodiment differs from the semiconductor laser apparatus 100 according to the first embodiment as follows.

As shown in FIG. 3, in the semiconductor laser apparatus 200 according to the embodiment, a p-electrode 32 in a blue-violet semiconductor laser device 3 extends closer to a second terminal 2P in the Y-direction than a side surface of an infrared semiconductor laser device 2 on the second terminal 2P side.

Moreover, a p-type pad electrode 22a is formed on a p-electrode 32 with an insulating film 4b therebetween. On top of the p-type pad electrode 22a is inserted a solder film H, on which is formed an infrared semiconductor laser device 2.

In addition, as shown in FIGS. 4(a) and 4(b), the p-type pad electrode 22a in the infrared semiconductor laser device 2 and a third terminal 3P are connected through a wire 2Wa, while the p-electrode 21 in the blue-violet semiconductor laser device 3 and the second terminal 2P are connected through a wire 3W.

In the present embodiment as described above, application of voltage between the mount 500 and the wire 3W enables driving the blue-violet semiconductor laser device 3. Similarly, application of voltage between the mount 500 and the wire 1Wa enables driving the red semiconductor laser device 1, and the application of voltage between the mount 500 and the wire 2Wa enables driving the infrared semiconductor laser device 2.

In this manner, each of the blue-violet semiconductor laser device 3, red semiconductor laser device 1, and infrared semiconductor laser device 2 can be driven independently.

Also, the blue-violet-beam-emission point 31 in the blue-violet semiconductor laser device 3 that emits a laser beam with a wavelength shorter than the wavelengths of laser beams emitted from the red semiconductor laser device 1 and the infrared semiconductor laser device 2 is located in the Y-direction between the red-beam-emission point 11 in the red semiconductor laser device 1 and the infrared-beam-emission point 21 in the infrared semiconductor laser device 2. This allows the blue-violet semiconductor laser device 3 to be easily positioned on a lens when the semiconductor laser apparatus 200 is used in an optical device such as an optical pick-up.

As a result, the effect of aberration around the periphery of the lens can be decreased, while the light utilization efficiency can be improved in the blue-violet semiconductor laser device 3.

Moreover, the p-electrode 32 in the blue-violet semiconductor laser device 3 extends in the Y-direction closer to the second terminal 2P than the side surface of the infrared semiconductor laser device 2 on the second terminal 2P side, so that the length of the wire 3W can be shorter which connects the second terminal 2P and the p-electrode 32 in the blue-violet semiconductor laser device 3 that emits the laser beam with a wavelength shorter than the wavelengths of a laser beam emitted from the red semiconductor laser device 1 and the infrared semiconductor laser device 2. This decreases the inductance component of the wire 3W, thereby driving the blue-violet semiconductor laser device 3 at high speed.

Further, the p-type pad electrode 12a in the red semiconductor laser device 1 and the first terminal 1P can be connected through the wire 1Wa simply and easily. Similarly, the p-electrode 32 in the blue-violet semiconductor laser device 3 and the second terminal 2P can be connected through the wire 3W simply and easily, and the p-type pad electrode 22a in the infrared semiconductor laser device 2 and the third terminal 3P can be connected through the wire 2Wa simply and easily.

Furthermore, it is preferred that the connection position of the p-type pad electrode 22a in the infrared semiconductor laser device 2 and the third terminal 2P is set on the opposite side of the laser beam emitting side of each of the red semiconductor laser device 1, infrared semiconductor laser device 2, and blue-violet semiconductor laser device 3 relative to at least one of the connection position of the p-type pad electrode 12a in the red semiconductor laser device 1 and the first terminal 1P and the connection position of the p-electrode 32 in the blue-violet semiconductor laser device 3 and the second terminal 2P. This prevents the wires 1Wa, 2Wa, 3W from crossing one another.

Note that the positions in which the red semiconductor laser device 1, infrared semiconductor laser device 2, and blue-violet semiconductor laser device 3 are arranged may also be set symmetrically, with the longitudinal direction of the third terminal 3P at the center.

Note also that each of the red semiconductor laser device 1 and the infrared semiconductor laser device 2 may have a monolithic structure.

A submount composed of silicon carbide or aluminum nitride may also be provided between the blue-violet semiconductor laser device 3 and the mount 500. In this manner, dissipation of heat from the blue-violet semiconductor laser device 3 is achieved.

In the foregoing first and second embodiments, the wire 1Wa corresponds to a first wire, the wire 2Wa corresponds to a second wire, the wire 3W corresponds to a third wire, the wire 1Wb corresponds to a fourth wire, and the wire 2Wb corresponds to a fifth wire. Also, the wires 1Wb, 2Wb in the foregoing first and second embodiments correspond to wires on the mount side.

Moreover, in the foregoing first and second embodiments, the Y-direction corresponds to a first direction, the Z-direction corresponds to a second direction, and the X-direction corresponds to a third direction. The stem 501 corresponds to a package, the red semiconductor laser device 1 corresponds to a first semiconductor laser device, the infrared semiconductor laser device 2 corresponds to a second semiconductor laser device, and the blue-violet semiconductor laser device 3 corresponds to a third semiconductor laser device.

In addition, in the foregoing first and second embodiments, the p-type pad electrode 12a corresponds to one electrode of the first semiconductor laser device, the p-type pad electrode 22a corresponds to one electrode of the second semiconductor laser device, and the p-electrode 32 corresponds to one electrode of the third semiconductor laser device. The n-electrode 13 corresponds to another electrode of the first semiconductor laser device, the n-electrode 23 corresponds to another electrode of the second semiconductor laser device, and the n-electrode 35 corresponds to another electrode of the third semiconductor laser device.

Third Embodiment

Figure 5:
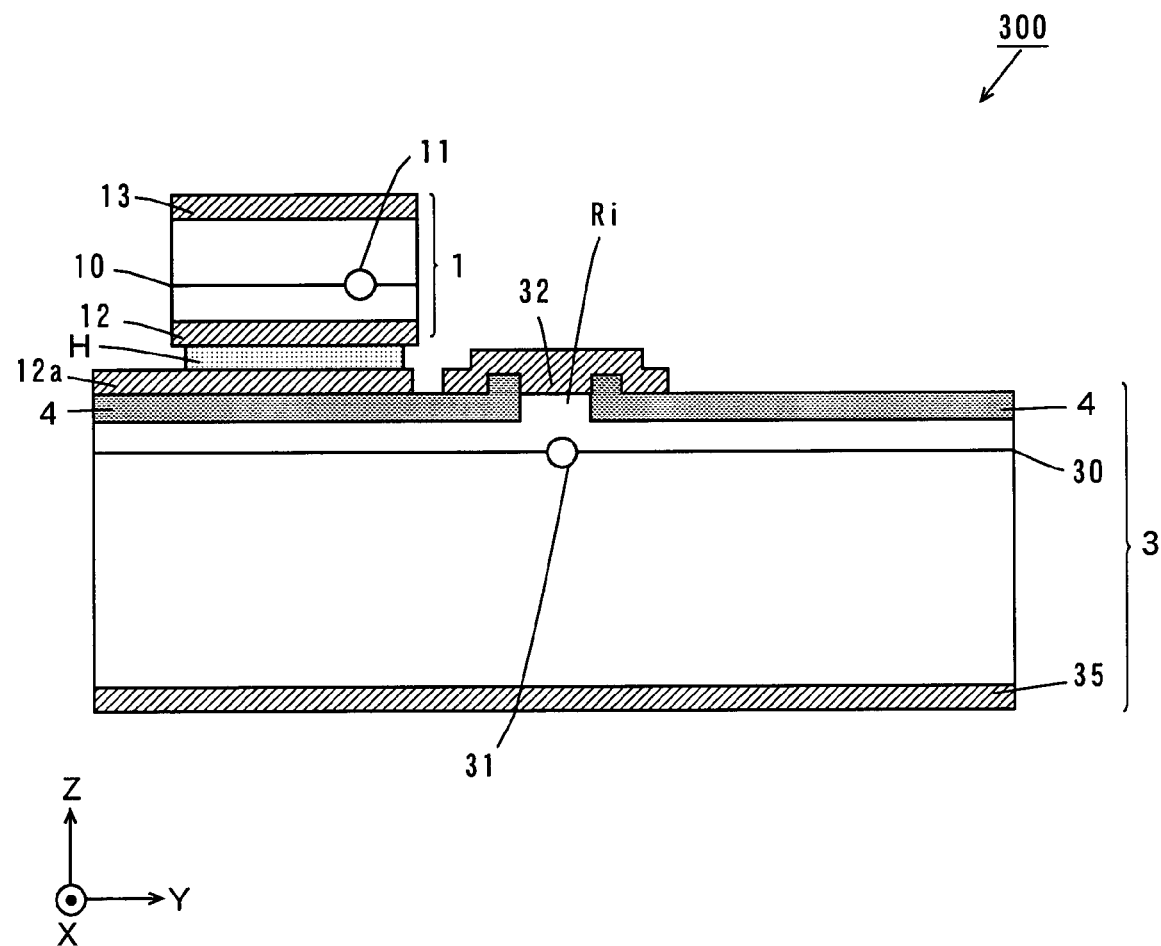
FIG. 5 is a schematic cross-section showing an example of a semiconductor laser apparatus according to a third embodiment.

FIG. 5 is a schematic cross-section showing an example of a semiconductor laser apparatus according to a third embodiment.

As shown in FIG. 5, the semiconductor laser apparatus 300 of the present embodiment differs from the semiconductor laser apparatus 100 of the first embodiment in that it does not include the infrared semiconductor laser device 2, solder film H (except the solder film H in the red semiconductor laser device 1), and p-type pad electrode 22a.

Figure 6:
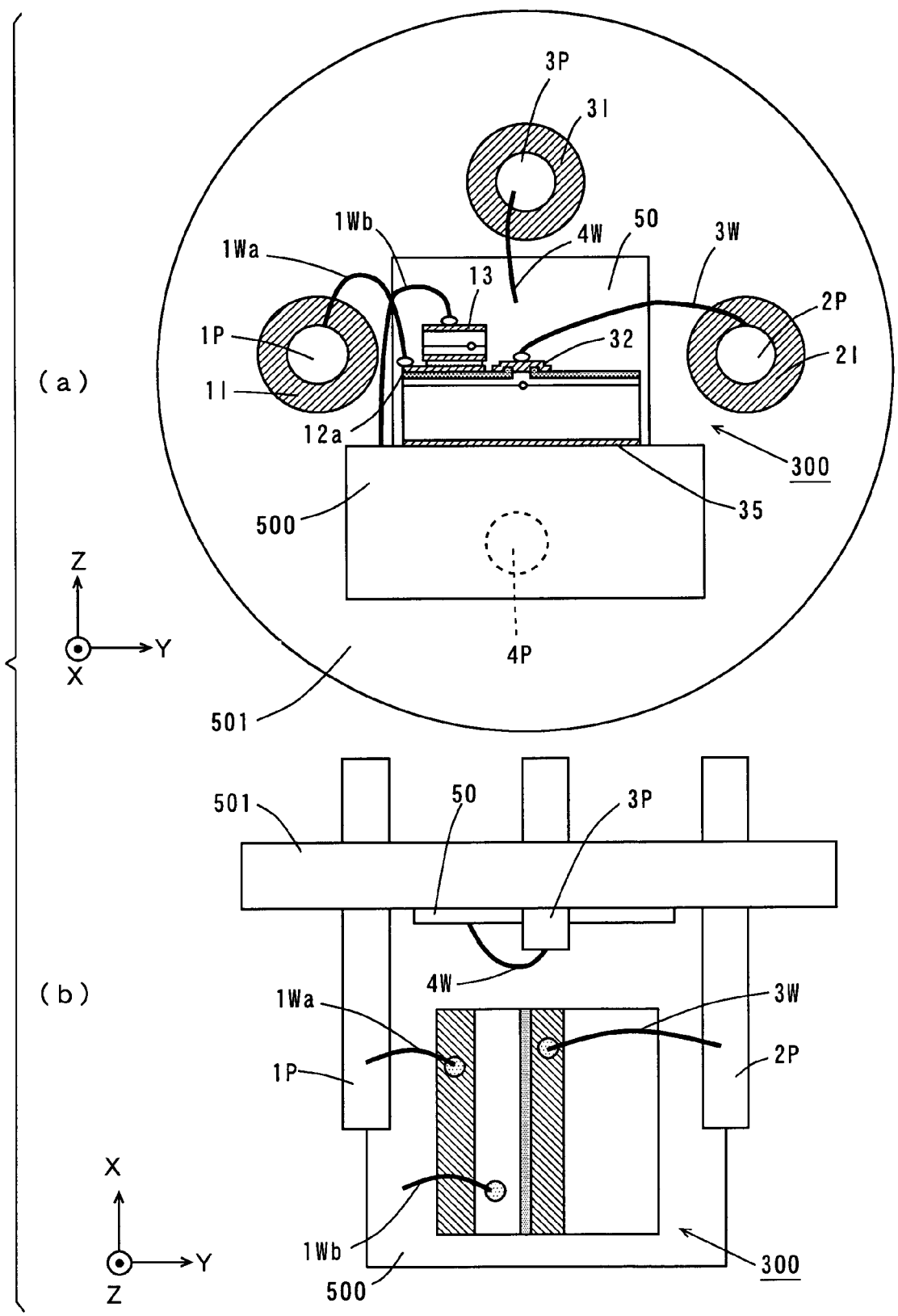
FIG. 6(a) is a schematic cross-section showing the semiconductor laser apparatus of FIG. 5 when assembled on a mount.
FIG. 6(b) is a top view of the semiconductor laser apparatus of FIG. 5 when assembled on the mount.

FIG. 6(a) is a schematic cross-section showing the semiconductor laser apparatus 300 of FIG. 5 when assembled on a mount. FIG. 6(b) is a top view of the semiconductor laser apparatus 300 of FIG. 5 when assembled on the mount.

As shown in FIGS. 6(a) and 6(b), an optical pick-up which is fabricated by assembling the semiconductor laser apparatus 300 of the present embodiment on the mount 500 differs as follows from the optical pick-up which is fabricated by assembling the semiconductor laser apparatus 100 of the first embodiment on the mount 500.

A photodiode 50 is electrically connected to a stem 501. The photodiode 50 and the third terminal 3P are connected through a wire 4W. Also, the p-electrode 32 in the blue-violet semiconductor laser device 3 and the second terminal 2P are connected through a wire 3W.

Now, description is made of the positions of the p-type pad electrode 12a and the p-electrode 32 in the blue-violet semiconductor laser device 3, and the positions of the first terminal 1P, second terminal 2P, and third terminal 3P.

The red semiconductor laser device 1 and the blue-violet semiconductor laser device 3, are arranged, respectively, such that the p-type pad electrode 12a is located closer to the first terminal 1P than the p-type electrode 32 in the blue-violet semiconductor laser device 3, and the p-electrode 32 in the blue-violet semiconductor laser device 3 is located closer to the second terminal 2P than the p-type pad electrode 12a.

This allows the first terminal 1P and the p-type pad electrode 12a to be connected through the wire 1Wa simply and easily, while allowing the secondterminal2Pandthe p-electrode 32 in the blue-violet semiconductor laser device 3 to be connected through the wire 3W simply and easily.

In addition, when the red semiconductor laser device 1 and the blue-violet semiconductor laser device 3 are viewed in the Z-direction, the wires 1Wa, 3W, 1Wb, 4W are not crossing one another.

In the present embodiment as described above, application of voltage between the mount 500 and the wire 3W enables driving the blue-violet semiconductor laser device 3, while application of voltage between the mount 500 and the wire 1Wa enables driving the red semiconductor laser device 1. In this manner, each of the blue-violet semiconductor laser device 3 and red semiconductor laser device 1 can be driven independently.

It is also preferred that the connection position of the wire 1Wa and the p-type pad electrode 12a in the red semiconductor laser device 1 and the connection position of the wire 3W and the p-electrode 32 in the blue-violet semiconductor laser device 3 are arranged in this order between the first terminal 1P and the second terminal 2P in the Y-direction. This prevents the wires 1Wa, 3W from crossing each other.

It is preferred that the first terminal 1P, second terminal 2P, third terminal 3P, and fourth terminal 4P are provided substantially concentrically on the stem 501, as shown in FIG. 6(a). This prevents each of the wires that connects each semiconductor laser device and each terminal from crossing one another.

A submount composed of silicon carbide or aluminum nitride may also be provided between the blue-violet semiconductor laser device 3 and the mount 500. In this manner, dissipation of heat from the blue-violet semiconductor laser device 3 is achieved.

Note that the red semiconductor laser device 1 may be replaced by an infrared semiconductor laser device.

In the foregoing third embodiment, the wire 1Wa corresponds to a first wire, the wire 3W corresponds to a second wire, and the wire 1Wb corresponds to a wire on the mount side. The Y-direction corresponds to a first direction, the Z-direction corresponds to a second direction, and the X-direction corresponds to a third direction. The stem 501 corresponds to a package, the red semiconductor laser device 1 corresponds to a first semiconductor laser device, and the blue-violet semiconductor laser device 3 corresponds to a second semiconductor laser device.

In the foregoing third embodiment, the p-type pad electrode 12a corresponds to one electrode of the first semiconductor laser device, and the p-electrode 32 corresponds to one electrode of the second semiconductor laser device. The n-electrode 13 corresponds to another electrode of the first semiconductor laser device, and the n-electrode 35 corresponds to another electrode of the second semiconductor laser device.

Fourth Embodiment

Figure 7:
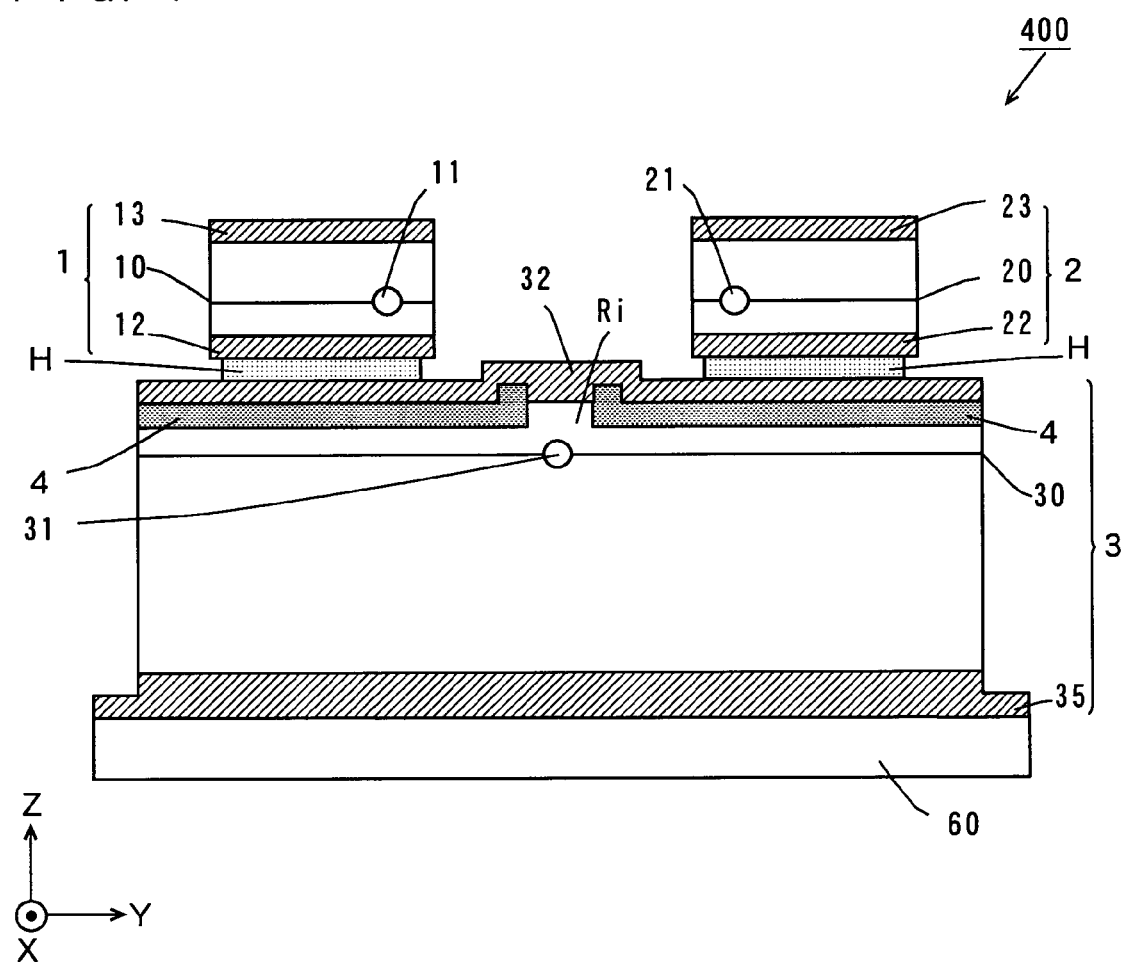
FIG. 7 is a schematic cross-section showing an example of a semiconductor laser apparatus according to a fourth embodiment.

FIG. 7 is a schematic cross-section showing an example of a semiconductor laser apparatus according to a fourth embodiment.

As shown in FIG. 7, the semiconductor laser apparatus 400 of the present embodiment differs from the semiconductor laser apparatus 100 of the first embodiment as follows.

A p-electrode 32 is formed to cover the insulating film 4 which is formed on an upper surface and both sides of a ridge portion Ri. Thus, the p-type pad electrodes 12a, 22a are not provided in the embodiment.

Then, on both sides of the p-electrode 32, a red semiconductor laser device 1 and an infrared semiconductor laser device 2, respectively, are formed with solder films H therebetween.

In this manner, the p-electrode 12 in the red semiconductor laser device 1, the p-electrode 22 in the infrared semiconductor laser device 2, and the p-electrode 32 in the blue-violet semiconductor laser device 3 are electrically connected in the semiconductor laser apparatus 400 of the embodiment An insulative submount 60 is provided between the above-mentioned blue-violet semiconductor laser device 3 and a mount 500.

Note that a conductive adhesive is applied to each of the electrode on the rear surface of the blue-violet semiconductor laser device 3 and a surface of the insulative submount 60, and then the blue-violet semiconductor laser device 3 and the insulative submount 60 are bonded by laminating them with the conductive adhesive. In this embodiment, the electrode on the rear surface of the blue-violet semiconductor laser device 3 and the conductive adhesive are the n-electrode 35.

As described above, the n-electrode 35 is formed such that its ends protrude outwardly from the blue-violet semiconductor laser device 3 when the insulative submount 60 is laminated with the n-electrode 35.

Figure 8:
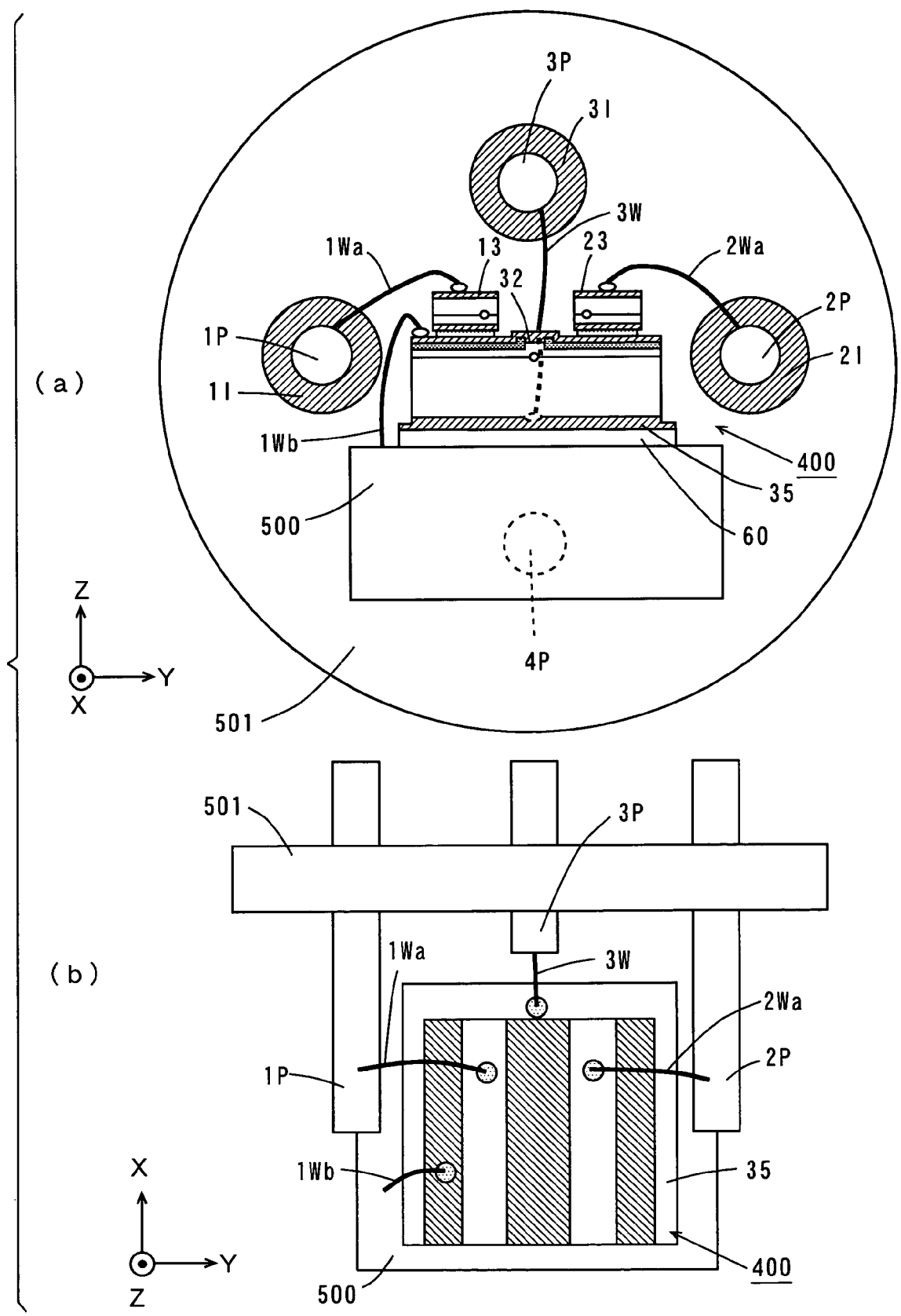
FIG. 8(a) is a schematic cross-section showing the semiconductor laser apparatus of FIG. 7 when assembled on a mount.
FIG. 8(b) is a top view of the semiconductor laser apparatus of FIG. 7 when assembled on the mount.

FIG. 8(a) is a schematic cross-section showing the semiconductor laser apparatus 400 of FIG. 7 when assembled on a mount. FIG. 8(b) is a top view of the semiconductor laser apparatus 400 of FIG. 7 when assembled on the mount.

As shown in FIGS. 8(a) and 8(b), an optical pick-up which is fabricated by assembling the semiconductor laser apparatus 400 of the present embodiment on the mount 500 differs as follows from the optical pick-up which is fabricated by assembling the semiconductor laser apparatus 100 of the first embodiment on the mount 500.

As described above, in the blue-violet semiconductor laser device 3, an insulative submount 60 is provided between an n-electrode 35 and the mount 500. Thus, the n-electrode 35 and the mount 500 are isolated by the insulative submount 60.

Also, the n-electrode 13 in the red semiconductor laser device 1 and the first terminal 1P are connected through the wire 1Wa, the n-electrode 23 in the infrared semiconductor laser device 2 and the second terminal 2P are connected through the wire 2Wa, and the n-electrode 35 in the blue-violet semiconductor laser device 3 and the third terminal 3P are connected through the wire 3W.

Further, the p-electrode 32 in the blue-violet semiconductor laser device 3 and the mount 500 are connected through the wire 1Wb. The wire 1Wb corresponds to a wire on the mount side.

With the above-described structure, when the red semiconductor laser device 1, the infrared semiconductor laser device 2, and the blue-violet semiconductor laser device 3 are viewed in the Z-direction, the wires 1Wa, 2Wa, 3W, 1Wb are not crossing one another.

In the present embodiment as described above, application of voltage between the mount 500 and the wire 3W enables driving the blue-violet semiconductor laser device 3. Similarly, application of voltage between the mount 500 and the wire 1Wa enables driving the red semiconductor laser device 1, and application of voltage between the mount 500 and the wire 2Wa enables driving the infrared semiconductor laser device 2.

In this manner, each of the blue-violet semiconductor laser device 3, red semiconductor laser device 1, and infrared semiconductor laser device 2 can be driven independently.

Moreover, the blue-violet-beam-emission point 31 in the blue-violet semiconductor laser device 3 that emits a laser beam with a wavelength shorter than the wavelengths of the laser beam from the red semiconductor laser device 1 and the infrared semiconductor laser device 2 is located in the Y-direction between the red-beam-emission point 11 in the red semiconductor laser device 1 and the infrared-beam-emission point 21 in the infrared semiconductor laser device 2. This allows the blue-violet semiconductor laser device 3 to be easily positioned on a lens when the semiconductor laser apparatus 400 is used in an optical device such as an optical pick-up.

As a result, the effect of aberration around the periphery of the lens can be decreased, while the light utilization efficiency can be improved in the blue-violet semiconductor laser device 3.

In addition, it is preferred that the connection position of the wire 1Wa and the n-electrode 13 in the red semiconductor laser device 1, the connection position of the wire 3W and the n-electrode 35 in the blue-violet semiconductor laser device 3, and the connection position of the wire 2Wa and the n-electrode 23 in the infrared semiconductor laser device 2 are arranged in this order between the first terminal 1P and the second terminal 2P in the Y-direction. This prevents the wires 1Wa, 2Wa, 3W from crossing one another.

Further, the length of the third terminal 3P is shorter than the length of each of the first terminal 1P and second terminal 2P. The red semiconductor laser device 1, the infrared semiconductor laser device 2, and the blue-violet semiconductor laser device 3 are arranged between the first terminal 1P and the second terminal 2P in the Y-direction. Also, the length of the third terminal 3P is set such that it does not overlap in the X-direction with the facet opposite to the facet on the laser beam emitting side of each of the red semiconductor laser device 1, infrared semiconductor laser device 2, and blue-violet semiconductor laser device 3. This allows the n-electrode 35 in the blue-violet semiconductor laser device 3 and the third terminal 3P to be connected simply and easily through the wire 3W.

It is preferred that the first terminal 1P, second terminal 2P, third terminal 3P, and fourth terminal 4P are provided substantially concentrically on the stem 501, as shown in FIG. 8(a). This prevents each of the wires that connects each semiconductor laser device and each terminal from crossing one another.

Note that the positions in which the red semiconductor laser device 1 and infrared semiconductor laser device 2 are arranged may be reversed.

Note also that each of the red semiconductor laser device 1 and infrared semiconductor laser device 2 may have a monolithic structure.

In the foregoing fourth embodiment, the wire 1Wa corresponds to a first wire, the wire 2Wa corresponds to a second wire, the wire 3W corresponds to a third wire, and the wire 1Wb corresponds to a fourth wire.

Moreover, in the foregoing fourth embodiment, the Y-direction corresponds to a first direction, the Z-direction corresponds to a second direction, and the X-direction corresponds to a third direction. The stem 501 corresponds to a package, the red semiconductor laser device 1 corresponds to a first semiconductor laser device, the infrared semiconductor laser device 2 corresponds to a second semiconductor laser device, and the blue-violet semiconductor laser device 3 corresponds to a third semiconductor laser device.

In addition, in the foregoing fourth embodiment, the n-electrode 13 corresponds to one electrode of the first semiconductor laser device, the n-electrode 23 corresponds to one electrode of the second semiconductor laser device, and the n-electrode 35 corresponds to one electrode of the third semiconductor laser device. The p-electrode 12 corresponds to another electrode of the first semiconductor laser device, the p-electrode 22 corresponds to another electrode of the second semiconductor laser device, and the p-electrode 32 corresponds to another electrode of the third semiconductor laser device.

Fifth Embodiment

Figure 9:
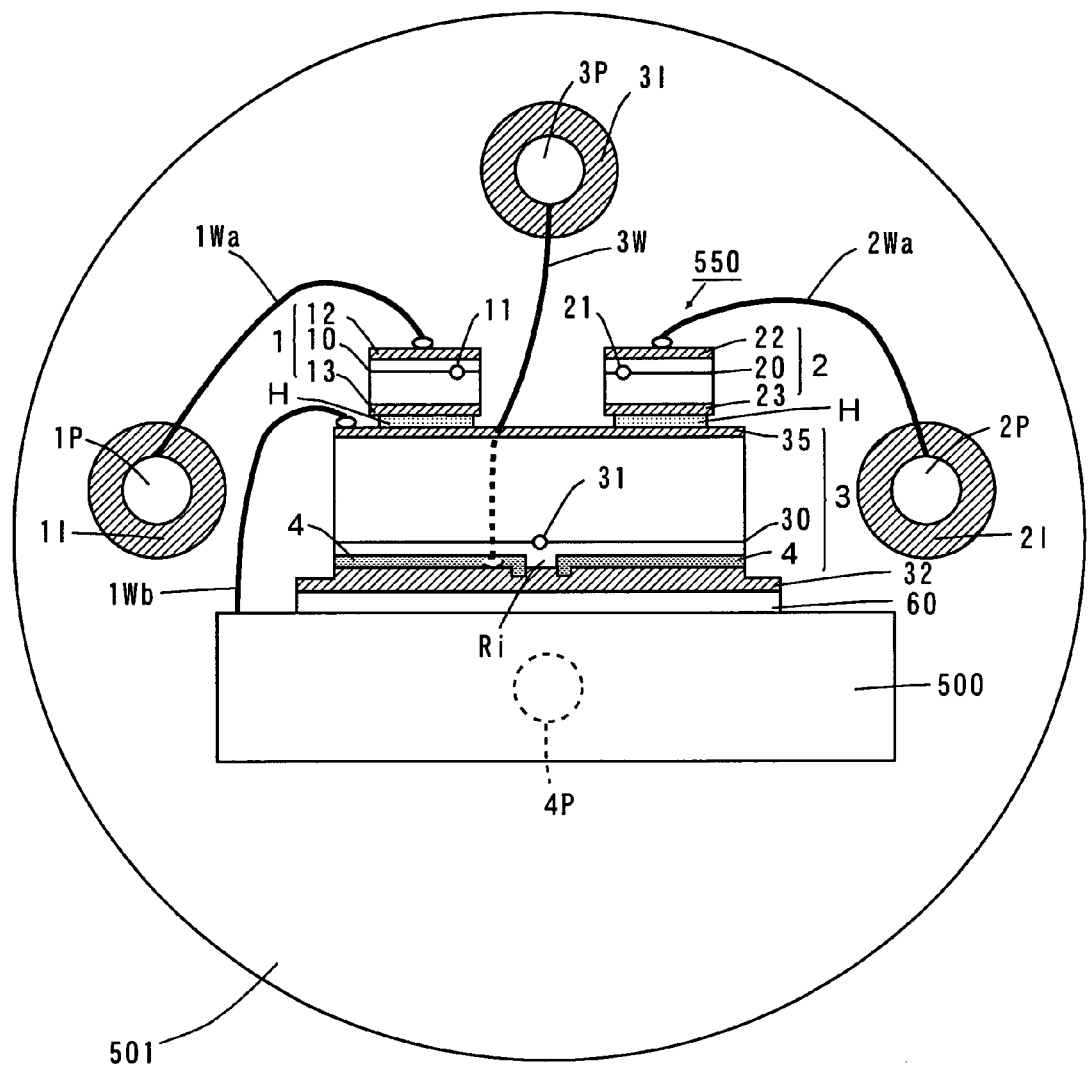
FIG. 9 is a schematic cross-section showing a semiconductor laser apparatus according to a fifth embodiment when assembled on a mount.

FIG. 9 is a schematic cross-section showing a semiconductor laser apparatus according to a fifth embodiment when assembled on a mount.

The semiconductor laser apparatus 550 of the present embodiment differs from the semiconductor laser apparatus 100 of the first embodiment as follows.

As shown in FIG. 9, the blue-violet semiconductor laser device 3 has a stripe-like ridge portion on a lower surface side. An insulating film 4 is formed on both sides of the ridge portion Ri. A p-electrode 32 is formed to cover a lower surface of the ridge portion Ri, and an n-electrode 35 is formed on an upper surface of the blue-violet semiconductor laser device 3. In the blue-violet semiconductor laser device 3, a p-n junction surface 30 is formed where a p-type semiconductor and an n-type semiconductor are joined together.

The red semiconductor laser device 1 has an n-electrode 13 formed on a lower surface and a p-electrode 12 formed on an upper surface. In the red semiconductor laser device 1, a p-n junction surface 10 is formed where a p-type semiconductor and an n-type semiconductor are joined together.

The infrared semiconductor laser device 2 has an n-electrode 23 formed on a lower surface and a p-electrode 22 formed on an upper surface. In the infrared semiconductor laser device 2, a p-n junction surface 20 is formed where a p-type semiconductor and an n-type semiconductor are joined together.

The red semiconductor laser device 1 and the infrared semiconductor laser device 2, respectively, are formed on the n-electrode 35 with solder films H therebetween.

In this manner, in the semiconductor laser apparatus 550 of the present embodiment, the n-electrode 13 in the red semiconductor laser device 1, the n-electrode 23 in the infrared semiconductor laser device 2, and the n-electrode 35 in the blue-violet semiconductor laser device 3 are electrically connected.

An optical pick-up fabricated by assembling the semiconductor laser apparatus 550 of the embodiment on the mount 500 differs as follows from the optical pick-up fabricated by assembling the semiconductor laser apparatus 100 of the first embodiment on the mount 500.

An insulative submount 60 is provided between the p-electrode 32 in the blue-violet semiconductor laser device 3 and the mount 500. Thus, the p-electrode 32 and the mount 500 are isolated by the insulative submount 60.

Also, the p-electrode 12 in the red semiconductor laser device 1 and the first terminal 1P are connected through the wire 1Wa, the p-electrode 22 in the infrared semiconductor laser device 2 and the second terminal 2P are connected through the wire 2Wa, and the p-electrode 32 in the blue-violet semiconductor laser device 3 and the third terminal 3P are connected through the wire 3W.

In addition, the n-electrode 35 in the blue-violet semiconductor laser device 3 and the mount 500 are connected through the wire 1Wb. The wire 1Wb corresponds to a wire on the mount side.

With the above-described structure, when the red semiconductor laser device 1, infrared semiconductor laser device 2, and blue-violet semiconductor laser device 3 are viewed in the Z direction, the wires 1Wa, 2Wa, 3W, 1Wb are not crossing one another.

In the present embodiment as described above, application of voltage between the mount 500 and the wire 3W enables driving the blue-violet semiconductor laser device 3. Similarly, application of voltage between the mount 500 and the wire 1Wa enables driving the red semiconductor laser device 1, and the application of voltage between the mount 500 and the wire 2Wa enables driving the infrared semiconductor laser device 2.

In this manner, each of the blue-violet semiconductor laser device 3, red semiconductor laser device 1, and infrared semiconductor laser device 2 can be driven independently.

In addition, the blue-violet-beam-emission point 31 in the blue-violet semiconductor laser device 3 that emits a laser beam with a wavelength shorter than the wavelengths of the laser beams from the red semiconductor laser device 1 and the infrared semiconductor laser device 2 is located in the Y-direction between the red-beam-emission point 11 in the red semiconductor laser device 1 and the infrared-beam-emission point 21 in the infrared semiconductor laser device 2. This allows the blue-violet semiconductor laser device 3 to be easily positioned on a lens when the semiconductor laser apparatus 550 is used in an optical device such as an optical pick-up.

As a result, the effect of aberration around the periphery of the lens can be decreased, while the light utilization efficiency can be improved in the blue-violet semiconductor laser device 3.

It is also preferred that the connection position of the wire 1Wa and the p-electrode 12 in the red semiconductor laser device 1, the connection position of the wire 3W and the p-electrode 32 in the blue-violet semiconductor laser device 3, and the connection position of the wire 2Wa and the p-electrode 22 in the infrared semiconductor laser device 2 are arranged in this order between the first terminal 1P and the second terminal 2P in the Y-direction. This prevents the wires 1Wa, 2Wa, 3W from crossing one another.

Further, the length of the third terminal 3P is shorter than the length of each of the first terminal 1P and second terminal 2P. The red semiconductor laser device 1, the infrared semiconductor laser device 2, and the blue-violet semiconductor laser device 3 are arranged between the first terminal 1P and the second terminal 2P in the Y-direction. Also, the length of the third terminal 3P is located such that it does not overlap in the X-direction with the facet opposite to the facet on the laser beam emitting side of each of the red semiconductor laser device 1, infrared semiconductor laser device 2, and blue-violet semiconductor laser device 3. This allows the p-electrode 32 in the blue-violet semiconductor laser device 3 and the third terminal 3P to be connected simply and easily through the wire 3W.

As shown in FIG. 9, it is preferred that the first terminal 1P, second terminal 2P, third terminal 3P and fourth terminal 4P are provided substantially concentrically on the stem 501. This prevents each of the wires that connects each semiconductor laser device and each terminal from crossing one another.

Note that the positions in which the red semiconductor laser device 1 and infrared semiconductor laser device 2 are arranged may be reversed.

The red semiconductor laser device 1 and infrared semiconductor laser device 2 may each have a monolithic structure.

In the foregoing fifth embodiment, the wire 1Wa corresponds to a first wire, the wire 2Wa corresponds to a second wire, the wire 3W corresponds to a third wire, and the wire 1Wb corresponds to a fourth wire.

Moreover, in the foregoing fifth embodiment, the Y-direction corresponds to a first direction, the Z-direction corresponds to a second direction, and the X-direction corresponds to a third direction. The stem 501 corresponds to a package, the red semiconductor laser device 1 corresponds to a first semiconductor laser device, the infrared semiconductor laser device 2 corresponds to a second semiconductor laser device, and the blue-violet semiconductor laser device 3 corresponds to a third semiconductor laser device.

In addition, in the foregoing fifth embodiment, the p-electrode 12 corresponds to one electrode of the first semiconductor laser device, the p-electrode 22 corresponds to one electrode of the second semiconductor laser device, and the p-electrode 32 corresponds to one electrode of the third semiconductor laser device. The n-electrode 13 corresponds to another electrode of the first semiconductor laser device, the n-electrode 23 corresponds to another electrode of the second semiconductor laser device, and the n-electrode 35 corresponds to another electrode of the third semiconductor laser device.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser apparatus comprising:
an electrically conducting package;
an electrically conducting mount provided on said package;
first, second, and third terminals that are provided on said package and isolated from said package;
a fourth terminal that is provided on said package and electrically connected to said mount; and
first, second, and third semiconductor laser devices that are provided on said mount, each having a first electrode, wherein
said first terminal and said second terminal are arranged along a first direction,
said third terminal and said fourth terminal are arranged along a second direction that crosses with said first direction,
said first, second, and third semiconductor laser devices are arranged such that said first electrode of said first semiconductor laser device is located closer to said first terminal than said first electrodes of said second and third semiconductor laser devices, said first electrode of said second semiconductor laser device is located closer to said second terminal than said first electrodes of said first and third semiconductor laser devices, and at least a portion of said first electrode of said third semiconductor laser device is located between said first electrode of said first semiconductor laser device and said first electrode of said second semiconductor laser device in said first direction,
said first terminal and said first electrode of said first semiconductor laser device are connected through a first wire, and said second terminal and said first electrode of said second semiconductor laser device are connected through a second wire,
said third semiconductor laser device further has a second electrode that is electrically connected to said mount, and
said first semiconductor laser device and said second semiconductor laser device are provided on said third semiconductor laser device,
said third semiconductor laser device has a first surface and has an insulating film formed on said first surface excluding a region of said first surface corresponding to an emission point,
said first electrode of said third semiconductor laser device is formed at least in said region corresponding to the emission point,
said first electrode of said first semiconductor laser device is formed on said insulating film on one side of said region corresponding to the emission point of said third semiconductor laser device,
said first electrode of said second semiconductor laser device is formed on said insulating film on the other side of said region corresponding to the emission point of said third semiconductor laser device, and said first and second semiconductor laser devices are located with a spacing therebetween above said region corresponding to the emission point of said third semiconductor laser device, and said third terminal and said first electrode of said third semiconductor laser device are connected through a third wire via said spacing between said first and second semiconductor laser devices.

2. The semiconductor laser apparatus according to claim 1, wherein said third semiconductor laser device has a ridge portion formed on said first electrode side of said third semiconductor laser device and an insulating film formed on side surfaces of said ridge portion, and said ridge portion is provided between said first semiconductor laser device and said second semiconductor laser device.

3. The semiconductor laser apparatus according to claim 1, wherein a first connection position of said first wire and said first electrode of said first semiconductor laser device, a third connection position of said third wire and said first electrode of said third semiconductor laser device, and a second connection position of said second wire and said first electrode of said second semiconductor laser device are arranged in this order from said first terminal side to said second terminal side in said first direction.

4. The semiconductor laser apparatus according to claim 3, wherein said third connection position is set on an opposite side of a laser beam emitting side of each of said first, second, and third semiconductor laser devices relative to at least one of said first and second connection positions.

5. The semiconductor laser apparatus according to claim 3, wherein said first, second, and third terminals extend from one side to another side along a third direction that crosses with said first direction and said second direction, said first, second, and third semiconductor laser devices are arranged to emit main laser beams toward said other side along said third direction, each of said first and second semiconductor laser devices further has an a second electrode, and said second electrode of said first semiconductor laser device is electrically connected to said mount through a fourth wire in a position on the laser beam emitting side of said first semiconductor laser device relative to said first connection position.

6. The semiconductor laser apparatus according to claim 5, wherein said second electrode of said second semiconductor laser device is electrically connected to said mount through a fifth wire in a position on the laser beam emitting side of said second semiconductor laser device relative to said second connection position.

7. A semiconductor laser apparatus comprising:
an electrically conducting package;
an electrically conducting mount provided on said package;
first, second, and third terminals that are provided on said package and isolated from said package;
a fourth terminal that is provided on said package and electrically connected to said mount; and
first, second, and third semiconductor laser devices that are provided on said mount, each having a first electrode and a second electrode, wherein said first terminal and said second terminal are arranged along a first direction, said third terminal and said fourth terminal are arranged along a second direction that crosses with said first direction, said first, second, and third semiconductor laser devices are arranged such that said first electrode of said first semiconductor laser device is located closer to said first terminal than said first electrodes of said second and third semiconductor laser devices, and said first electrode of said second semiconductor laser device is located closer to said second terminal than said first electrodes of said first and third semiconductor laser devices, said semiconductor laser apparatus further comprises a submount between said first electrode of said third semiconductor laser device and said mount, said first electrode of said third semiconductor laser device is formed on said submount to protrude from said third semiconductor laser device along a third direction that crosses with said first direction and said second direction, said first terminal and said first electrode of said first semiconductor laser device are connected through a first wire, said second terminal and said first electrode of said second semiconductor laser device are connected through a second wire, and said third terminal and said protruding portion of said first electrode of said third semiconductor laser device are connected through a third wire on said submount, and said second electrode of said third semiconductor laser device is electrically connected to said mount, said third semiconductor laser device has a first surface and has an insulating film formed on said first surface excluding a region of said first surface corresponding to an emission point, said second electrode of said third semiconductor laser device is formed at least in said region corresponding to the emission point, said second electrode of said first semiconductor laser device is formed on said insulating film on one side of said region corresponding to the emission point of said third semiconductor laser device, said second electrode of said second semiconductor laser device is formed on said insulating film on the other side of said region corresponding to the emission point of said third semiconductor laser device, and said first and second semiconductor laser devices are located with a spacing therebetween above said region corresponding to the emission point of said third semiconductor laser device.

8. The semiconductor laser apparatus according to claim 7, wherein at least a portion of said first electrode of said third semiconductor laser device is located closer to said third terminal than said first electrodes of said first and second semiconductor laser devices.

9. The semiconductor laser apparatus device according to claim 7, wherein said first semiconductor laser device and said second semiconductor laser device are provided on said third semiconductor laser device.

10. The semiconductor laser apparatus according to claim 7, wherein a first connection position of said first wire and said first electrode of said first semiconductor laser device, a third connection position of said third wire and said first electrode of said third semiconductor laser device, and a second connection position of said second wire and said first electrode of said second semiconductor laser device are arranged in this order from said first terminal side to said second terminal side in said first direction.

11. The semiconductor laser apparatus according to claim 10, wherein
said third connection position is set on an opposite side of a laser beam emitting side of each of said first, second, and third semiconductor laser devices relative to at least one of said first and second connection positions.

12. The semiconductor laser apparatus according to claim 10, wherein
said first, second, and third terminals extend from one side to another side along a third direction that crosses with said first direction and said second direction,
said first, second, and third semiconductor laser devices are arranged to emit main laser beams toward said other side along said third direction,
said second electrodes of said first, second, and third semiconductor laser devices are electrically connected with one another, and
said second electrode of said third semiconductor laser device is electrically connected to said mount through a fourth wire in a position on the laser beam emitting side of said first semiconductor laser device relative to said first connection position.

13. A semiconductor laser apparatus comprising:
an electrically conducting package;
an electrically conducting mount provided on said package;
first, second, and third terminals that are provided on said package and isolated from said package;
a fourth terminal that is provided on said package and electrically connected to said mount; and
first, second, and third semiconductor laser devices that are provided on said mount, each having a first electrode, wherein
said first terminal and said second terminal are arranged along a first direction,
said third terminal and said fourth terminal are arranged along a second direction that crosses with said first direction,
an emission portion of said first semiconductor laser device, an emission portion of said third semiconductor laser device, and an emission portion of said second semiconductor laser device are arranged in this order from said first terminal side to said second terminal side along said first direction,
said first terminal and said first electrode of said first semiconductor laser device are connected through a first wire, and said third terminal and said first electrode of said second semiconductor laser device are connected through a second wire,
said third semiconductor laser device emits a laser beam with a wavelength shorter than the wavelengths of laser beams emitted from said first and second semiconductor laser devices, and further has a second electrode which is electrically connected to said mount,
said third semiconductor laser device has a first surface and has an insulating film formed on said first surface excluding a region of said first surface corresponding to an emission point,
said first electrode of said third semiconductor laser device extends in the first direction from said region corresponding to the emission point closer to said second terminal than a side surface of said second semiconductor laser device on said second terminal side so that a part of said first electrode of said third semiconductor laser device is exposed between said side surface of said second semiconductor laser device and said second terminal,
said first electrode of said first semiconductor laser device is formed on said insulating film on one side of said region corresponding to the emission point of said third semiconductor laser device,
said first electrode of said second semiconductor laser device is formed on said insulating film on the other side of said region corresponding to the emission point of said third semiconductor laser device,
said first and second semiconductor laser devices are located with a spacing therebetween above said region corresponding to the emission point of said third semiconductor laser device and
said second terminal and said exposed part of said first electrode of said third semiconductor laser device are connected through a third wire.

14. The semiconductor laser apparatus according to claim 13, wherein
said first, second, and third terminals extend from one side to another side along a third direction that crosses with said first direction and said second direction,
said first, second, and third semiconductor laser devices are arranged to emit main laser beams toward said other side along said third direction,
each of said first and second semiconductor laser devices further has a second electrode, and
said second electrode of said first semiconductor laser device is electrically connected to said mount through a fourth wire in a position on the laser beam emitting side of said first semiconductor laser device relative to a first connection position of said first wire and said first electrode of said first semiconductor laser device.

15. The semiconductor laser apparatus according to claim 14, wherein
said second electrode of said second semiconductor laser device is electrically connected to said mount through a fifth wire in a position on the laser beam emitting side of said second semiconductor laser device relative to a second connection position of said second wire and said first electrode of said second semiconductor laser device.

16. The semiconductor laser apparatus according to claim 15, wherein
said second connection position is set on an opposite side of a laser beam emitting side of each of said first, second, and third semiconductor laser devices relative to at least one of said first connection position and a third connection position of said third wire and said first electrode of said third semiconductor laser device.

17. The semiconductor laser apparatus according to claim 5, wherein
when said first, second, and third semiconductor laser devices are viewed in said second direction, said first, second, third and fourth wires are not crossing one another.

18. The semiconductor laser apparatus according to claim 1, wherein
said third semiconductor laser device includes an active layer composed of a nitride-based semiconductor.

19. The semiconductor laser apparatus according to claim 1, wherein
the length of said third terminal is shorter than the length of each of said first and second terminals, said first, second, and third terminals extend from one side to another side along a third direction that crosses with said first direction and said second direction, said first, second, and third semiconductor laser devices are arranged to emit main laser beams toward said other side along said third direction, said first, second, and third semiconductor laser devices are arranged between said first terminal and said second terminal in said first direction, and the length of said third terminal is set such that said third terminal does not overlap with a facet opposite to a laser beam emitting side of each of said first, second, and third semiconductor laser devices.

20. The semiconductor laser apparatus according to claim 7, wherein said first electrode of said third semiconductor laser device is formed between said third semiconductor laser device and said submount.

21. A semiconductor laser apparatus comprising:

an electrically conducting package;

an electrically conducting mount provided on said package;

first, second, and third terminals that are provided on said package and isolated from said package;

a fourth terminal that is provided on said package and electrically connected to said mount; and first, second, and third semiconductor laser devices that are provided on said mount, each having a first electrode and a second electrode, wherein said first terminal and said second terminal are arranged along a first direction, said third terminal and said fourth terminal are arranged along a second direction that crosses with said first direction, said first, second, and third semiconductor laser devices are arranged such that said first electrode of said first semiconductor laser device is located closer to said first terminal than said first electrodes of said second and third semiconductor laser devices, and said first electrode of said second semiconductor laser device is located closer to said second terminal than said first electrodes of said first and third semiconductor laser devices, said semiconductor laser apparatus further comprises a submount between said first electrode of said third semiconductor laser device and said mount, said first electrode of said third semiconductor laser device is formed on said submount to protrude from said third semiconductor laser device, said first terminal and said first electrode of said first semiconductor laser device are connected through a first wire, said second terminal and said first electrode of said second semiconductor laser device are connected through a second wire, and said third terminal and said first electrode of said third semiconductor laser device are connected through a third wire on said submount, and said second electrode of said third semiconductor laser device is electrically connected to said mount, wherein said first electrode of said third semiconductor laser device is formed between said semiconductor laser device and said submount.

* * * * *